US012690146B2

(12) United States Patent
Chang et al.

(10) Patent No.: US 12,690,146 B2
(45) Date of Patent: Jul. 21, 2026

(54) ELECTRONIC DEVICE AND MOUNTING ACCESSORY

(71) Applicant: VIA Technologies, Inc., New Taipei City (TW)

(72) Inventors: Chi Chang Chang, New Taipei City (TW); Ya-Ling Chen, New Taipei City (TW)

(73) Assignee: VIA Technologies, Inc., New Taipei City (TW)

( * ) Notice: Subject to any disclaimer, the term of this patent is extended or adjusted under 35 U.S.C. 154(b) by 71 days.

(21) Appl. No.: 19/001,421

(22) Filed: Dec. 25, 2024

(65) Prior Publication Data

US 2026/0107392 A1 Apr. 16, 2026

(30) Foreign Application Priority Data

Oct. 14, 2024 (TW) .................................. 113138938

(51) Int. Cl.
*H05K 5/02* (2006.01)

(52) U.S. Cl.
CPC .................................. *H05K 5/0204* (2013.01)

(58) Field of Classification Search
None
See application file for complete search history.

(56) References Cited

U.S. PATENT DOCUMENTS 5,163,649 A 11/1992 Schehr
10,734,093 B1 * 8/2020 Bala ..................... H05K 5/0204

2011/0267794 A1 * 11/2011 Anderson ............ H05K 7/1489
361/810
2012/0305307 A1 * 12/2012 Korcz .................... H02G 3/086
174/559
2015/0263497 A1 * 9/2015 Korcz ..................... H02G 3/12
220/3.3

FOREIGN PATENT DOCUMENTS

CN 112635955 A * 4/2021 ............... H01Q 1/20
CN 113163647 A * 7/2021 ........... H05K 5/0204
CN 114909571 8/2022
CN 114923068 8/2022
CN 116293255 6/2023
CN 219389134 7/2023
JP H01173975 U * 12/1989

OTHER PUBLICATIONS

"Notice of allowance of Taiwan Counterpart Application", issued on May 26, 2025, p. 1-p. 4.

* cited by examiner

*Primary Examiner* — James Wu
*Assistant Examiner* — Christopher L Augustin
(74) *Attorney, Agent, or Firm* — JCIPRNET

(57) ABSTRACT

An electronic device includes a device body and a mounting accessory. The mounting accessory includes a first lateral bracket and a second lateral bracket. When the first lateral bracket and the second lateral bracket are mounted on the device body in a first mounting configuration, the first lateral bracket and the second lateral bracket provide a set of locking points. When the first lateral bracket and the second lateral bracket are mounted on the device body in a second mounting configuration, the first lateral bracket and the second lateral bracket provide another set of locking points.

10 Claims, 12 Drawing Sheets

ELECTRONIC DEVICE AND MOUNTING ACCESSORY

CROSS-REFERENCE TO RELATED APPLICATION

This application claims the priority benefit of Taiwan application serial no. 113138938, filed on Oct. 14, 2024. The entirety of the above-mentioned patent application is hereby incorporated by reference herein and made a part of this specification.

BACKGROUND

Technical Field

The present disclosure relates to an electronic device, and more particularly to an electronic device with mounting accessories for attaching the device body of the electronic device to various objects.

Description of Related Art

Electronic devices might need to be mounted on specific objects, such as walls or vehicles, depending on the usage scenario. To mount the device body of the electronic device on a specific object, mounting accessories may be utilized. When the device body of an electronic device is potentially to be mounted on two different specific objects, two distinct mounting accessories are typically required. The selection of one of these two mounting accessories is made based on the intended usage scenario to affix the device body of the electronic device to the specific object. However, the unselected mounting accessory results in waste.

SUMMARY

The present disclosure provides an electronic device, wherein the mounting accessory thereof enables the device body of the electronic device to be mounted on either one of two distinct specific objects.

The present disclosure provides a mounting accessory, which enables the device body of the electronic device to be mounted on either one of two distinct specific objects.

An electronic device of the present disclosure includes a device body and a mounting accessory. The device body has a first body side, a second body side, and a body bottom surface. The second body side faces away from the first body side. The body bottom surface is connected to the first body side and the second body side. The first body side has at least one first body screw hole. The second body side has at least one second body screw hole. The mounting accessory includes a first lateral bracket and a second lateral bracket. The first lateral bracket has a first mounting side and a first mounting bottom. The first mounting side has at least one first lower mounting screw hole and at least one first upper mounting screw hole. The first mounting bottom has at least one first bottom mounting screw hole and at least one first bottom mounting stud. The second lateral bracket has a second mounting side and a second mounting bottom. The second mounting side has at least one second upper mounting screw hole and at least one second lower mounting screw hole. The second mounting bottom has at least one second bottom mounting screw hole and at least one second bottom mounting stud. The height of the at least one first bottom mounting stud is equal to the distance between the at least one first bottom mounting screw hole and the at least one first upper mounting screw hole. The height of the at least one second bottom mounting stud is equal to the distance between the at least one second bottom mounting screw hole and the at least one second upper mounting screw hole. When the at least one first lower mounting screw hole is fastened to the at least one first body screw hole by screws, and the at least one second lower mounting screw hole is fastened to the at least one second body screw hole by screws, the first lateral bracket and the second lateral bracket are respectively fixed on the device body. The at least one first bottom mounting stud is positioned outside the first mounting side relative to the device body, and the at least one second bottom mounting stud is positioned outside the second mounting side relative to the device body. The connection between the at least one first bottom mounting screw hole and the at least one second bottom mounting screw hole forms a straight line or a first shape. When the at least one first upper mounting screw hole is fastened to the at least one first body screw hole by screws, and the at least one second upper mounting screw hole is fastened to the at least one second body screw hole by screws, the first lateral bracket and the second lateral bracket are respectively fixed on the device body. The at least one first bottom mounting stud is positioned inside the first mounting side relative to the device body, and the at least one second bottom mounting stud is positioned inside the first mounting side relative to the device body. The connection between the at least one first bottom mounting stud and the at least one second bottom mounting stud forms a straight line or a second shape.

The mounting accessory of the present disclosure is adaptable for mounting a device body of an electronic device. The device body has a first body side, a second body side, and a body bottom surface. The second body side faces away from the first body side. The body bottom surface is connected to the first body side and the second body side. The first body side has at least one first body screw hole. The second body side has at least one second body screw hole. The mounting accessory includes a first lateral bracket and a second lateral bracket. The first lateral bracket has a first mounting side and a first mounting bottom. The first mounting side has at least one first lower mounting screw hole and at least one first upper mounting screw hole. The first mounting bottom has at least one first bottom mounting screw hole and at least one first bottom mounting stud. The second lateral bracket has a second mounting side and a second mounting bottom. The second mounting side has at least one second upper mounting screw hole and at least one second lower mounting screw hole. The second mounting bottom has at least one second bottom mounting screw hole and at least one second bottom mounting stud. The height of the at least one first bottom mounting stud is equal to the distance between the at least one first bottom mounting screw hole and the at least one first upper mounting screw hole. The height of the at least one second bottom mounting stud is equal to the distance between the at least one second bottom mounting screw hole and the at least one second upper mounting screw hole. When the at least one first lower mounting screw hole is fastened to the at least one first body screw hole by screws, and the at least one second lower mounting screw hole is fastened to the at least one second body screw hole by screws, the first lateral bracket and the second lateral bracket are respectively fixed on the device body. The at least one first bottom mounting stud is positioned outside the first mounting side relative to the device body, the at least one second bottom mounting stud is positioned outside the second mounting side relative to the device body, and the connection between the at least one first bottom mounting screw hole and the at least one second bottom mounting screw hole forms a straight line or a first shape. When the at least one first upper mounting screw hole is fastened to the at least one first body screw hole by screws, and the at least one second upper mounting screw hole is fastened to the at least one second body screw hole by screws, the first lateral bracket and the second lateral bracket are respectively fixed on the device body. The at least one first bottom mounting stud is positioned inside the first mounting side relative to the device body, the at least one second bottom mounting stud is positioned inside the first mounting side relative to the device body, and the connection between the at least one first bottom mounting stud and the at least one second bottom mounting stud forms a straight line or a second shape.

In view of the foregoing, in the present disclosure, the first lateral bracket and the second lateral bracket of the electronic device may be fastened to the device body in either a first mounting configuration or a second mounting configuration, thereby enabling the device body to be mounted on one of two distinct specific objects.

DESCRIPTION OF THE EMBODIMENTS

Figure 1:
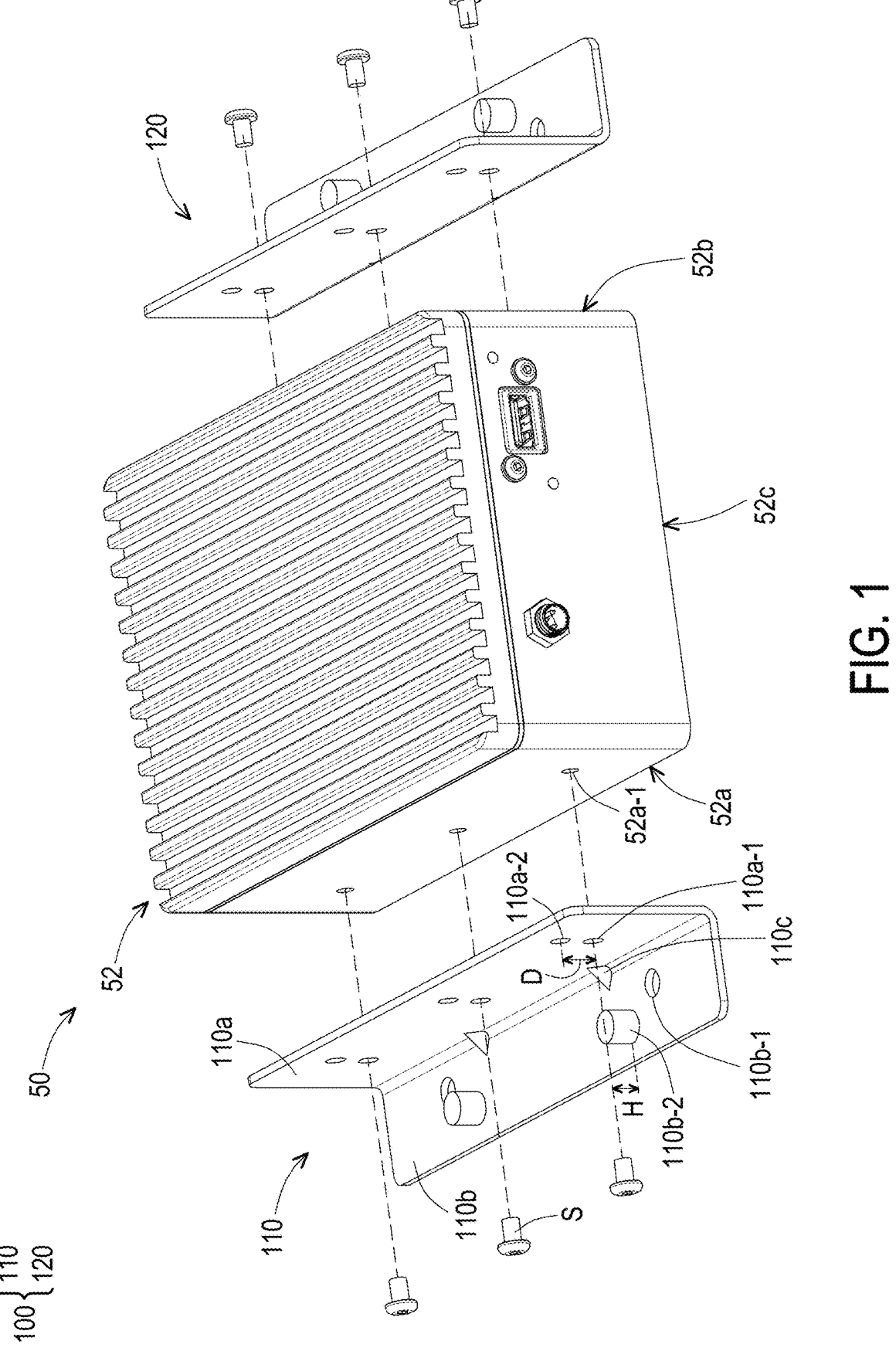
FIG. 1 is an exploded perspective front view of an electronic device in a first mounting configuration according to an embodiment of the present disclosure.

Please refer to FIG. 1 to FIG. 4. In the present embodiment, the electronic device 50 may be various types of electronic products, including but not limited to mobile devices, consumer products, industrial control products, and automotive products. The electronic device 50 includes a device body 52. The device body 52 has a first body side 52a, a second body side 52b, and a body bottom surface 52c. The second body side 52b faces away from the first body side 52a, and the body bottom surface 52c is connected to the first body side 52a and the second body side 52b. The first body side 52a has at least one first body screw hole 52a-1, and the second body side 52b has at least one second body screw hole 52b-1.

The electronic device 50 further includes a mounting accessory 100, which is utilized to mount the device body 52 on one of two different specific objects. In this embodiment, the mounting accessory 100 includes a first lateral bracket 110 and a second lateral bracket 120. The materials of the first lateral bracket 110 and the second lateral bracket 120 may be composed of SECC (electrogalvanized steel sheet) or SUS304 (stainless steel), but are not limited thereto.

The first lateral bracket 110 has a first mounting side 110a and a first mounting bottom 110b. The first mounting side 110a has at least one first lower mounting screw hole 110a-1 (illustrated herein with three exemplars) and at least one first upper mounting screw hole 110a-2 (illustrated herein with three exemplars). The first mounting bottom 110b has at least one first bottom mounting screw hole 110b-1 (illustrated herein with two exemplars) and at least one first bottom mounting stud 110b-2 (illustrated herein with two exemplars).

The second lateral bracket 120 has a second mounting side 120a and a second mounting bottom 120b. The second mounting side 120a has at least one second lower mounting screw hole 120a-1 (illustrated herein with three exemplars) and at least one second upper mounting screw hole 120a-2 (illustrated herein with three exemplars). The second mounting bottom 120b has at least one second bottom mounting screw hole 120b-1 (illustrated herein with two exemplars) and at least one second bottom mounting stud 120b-2 (illustrated herein with two exemplars).

Figure 2:
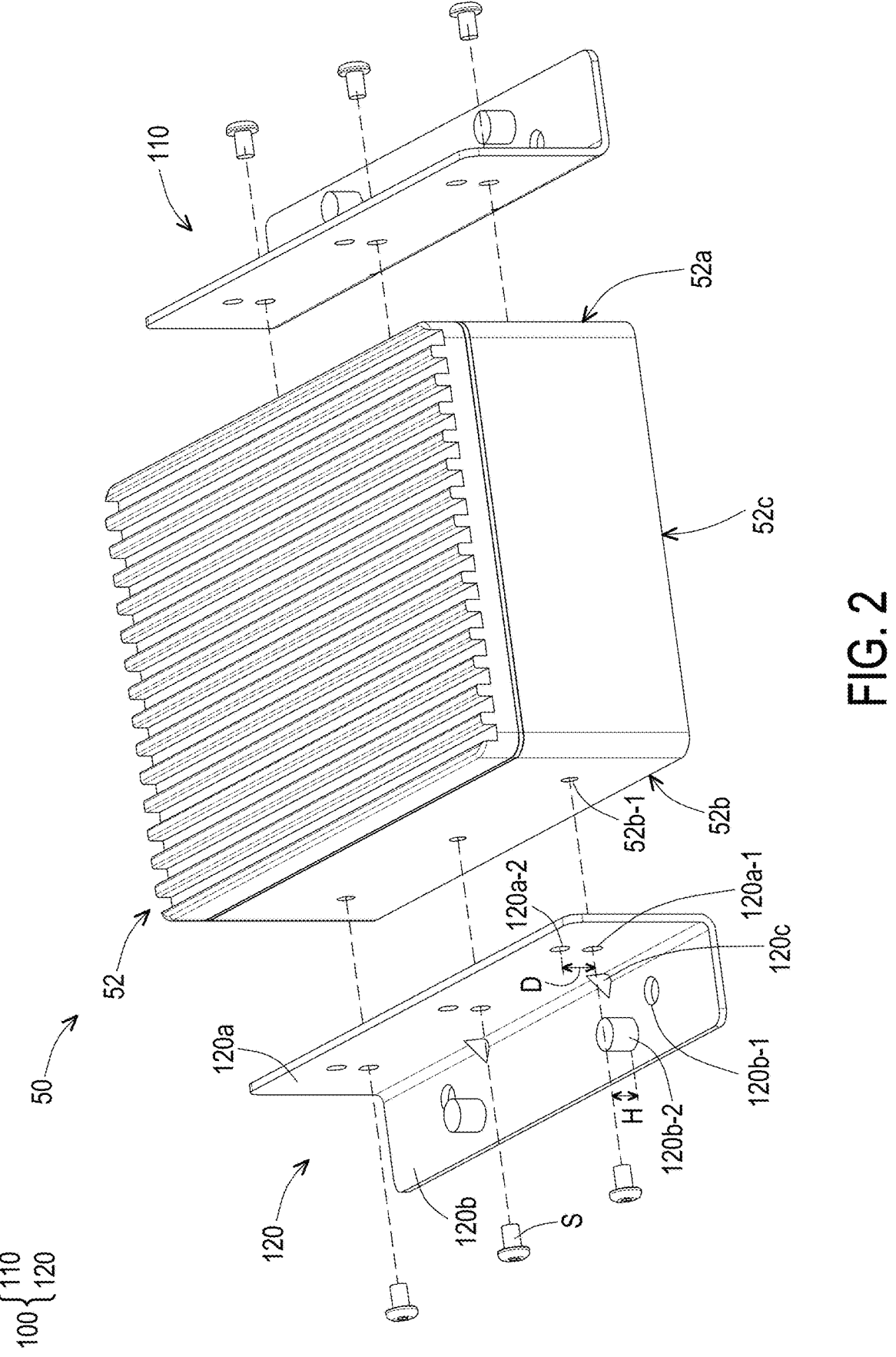
FIG. 2 is a rear exploded perspective view of the electronic device of FIG. 1 in the first mounting configuration.

The height H of the at least one first bottom mounting stud 110b-2 is equal to the distance D between the at least one first bottom mounting screw hole 110a-1 and at least one corresponding first upper mounting screw hole 110a-2, as illustrated in FIG. 1. The height H of the at least one second bottom mounting stud 120b-2 is equal to the distance D between the at least one second bottom mounting screw hole 120a-1 and at least one corresponding second upper mounting screw hole 120a-2, as illustrated in FIG. 2.

Please refer to FIG. 1 to FIG. 6. When the at least one first lower mounting screw hole 110a-1 is fastened to the at least one first body screw hole 52a-1 by screws S, and the at least one second lower mounting screw hole 120a-1 is fastened to the at least one second body screw hole 52b-1 by screws S, the first lateral bracket 110 and the second lateral bracket 120 are respectively fixed on the device body 52. The at least one first bottom mounting stud 110b-2 is positioned outside the first mounting side 110a relative to the device body 52, and the at least one second bottom mounting stud 120b-2 is positioned outside the second mounting side 120a relative to the device body 52, and the connection between the at least one first bottom mounting screw hole 110b-1 and the at least one second bottom mounting screw hole 120b-1 forms a straight line or a first shape R1. In this embodiment, the connection between the at least one first bottom mounting screw hole 110b-1 and the at least one second bottom mounting screw hole 120b-1 forms a first shape R1, for example, a rectangle, but is not limited thereto. The at least one first bottom mounting screw hole 110b-1 and the at least one second bottom mounting screw hole 120b-1 may constitute a set of locking points.

Please refer to FIG. 7 to FIG. 12. When the at least one first upper mounting screw hole 110a-2 is fastened to the at least one first body screw hole 52a-1 by screws S, and the at least one second upper mounting screw hole 120a-2 is fastened to the at least one second body screw hole 52b-1 by screws S, the first lateral bracket 110 and the second lateral bracket 120 are respectively fixed on the device body 52. The at least one first bottom mounting stud 110b-2 is positioned inside the first mounting side 110a relative to the device body 52, the at least one second bottom mounting stud 120b-2 is positioned inside the second mounting side 120a relative to the device body 52, and the connection between the at least one first bottom mounting stud 110b-2 and the at least one second bottom mounting stud 120b-2 forms a straight line or a second shape R2. In this embodiment, the connection between the at least one first bottom mounting stud 110b-2 and the at least one second bottom mounting stud 120b-2 forms a second shape R2, for example, a square, but is not limited thereto. The at least one first bottom mounting stud 110b-2 and the at least one second bottom mounting stud 120b-2 may constitute another set of locking points.

Figure 6:
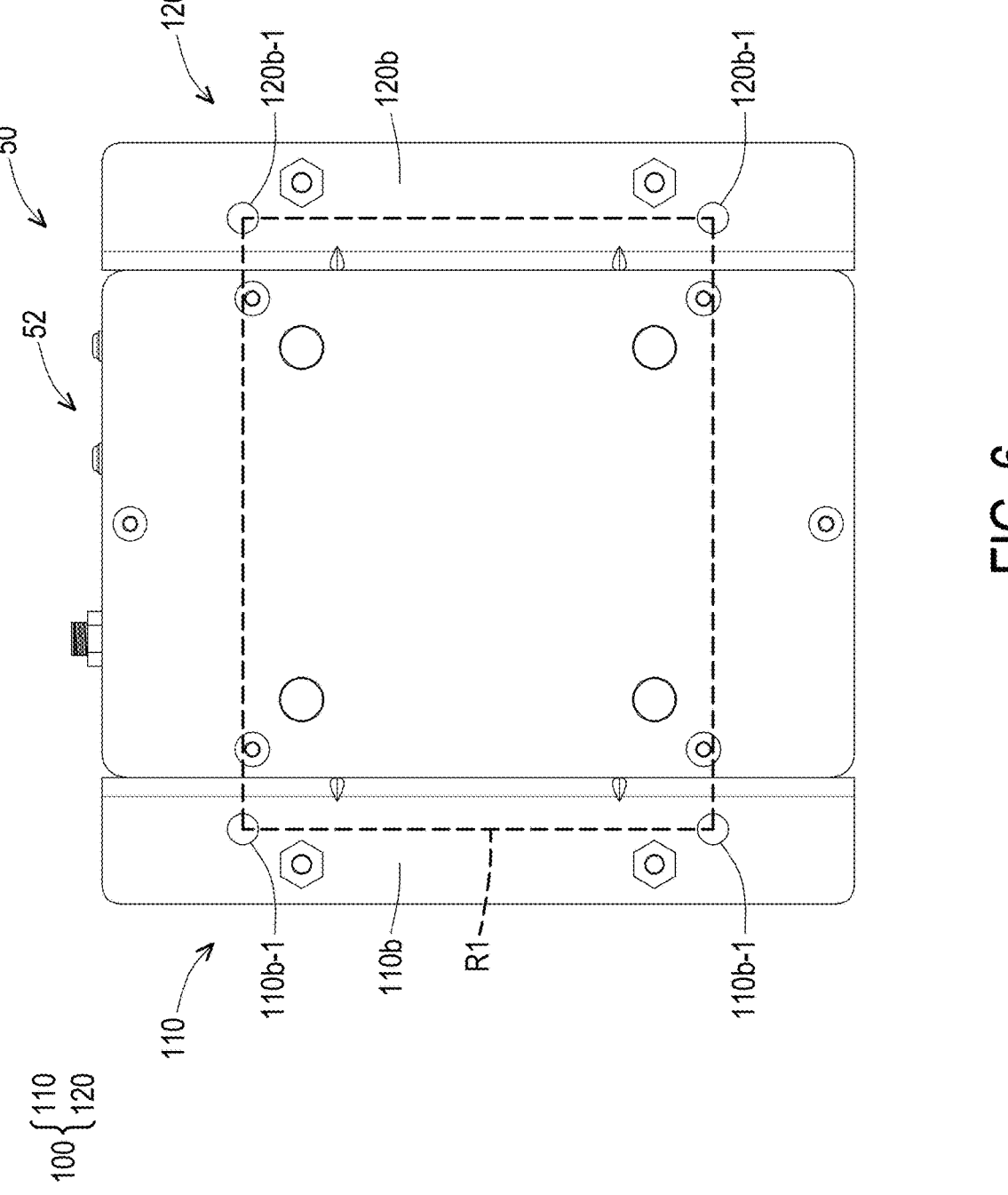
FIG. 6 is a bottom view of the electronic device of FIG. 3 in the first mounting configuration.
Figure 7:
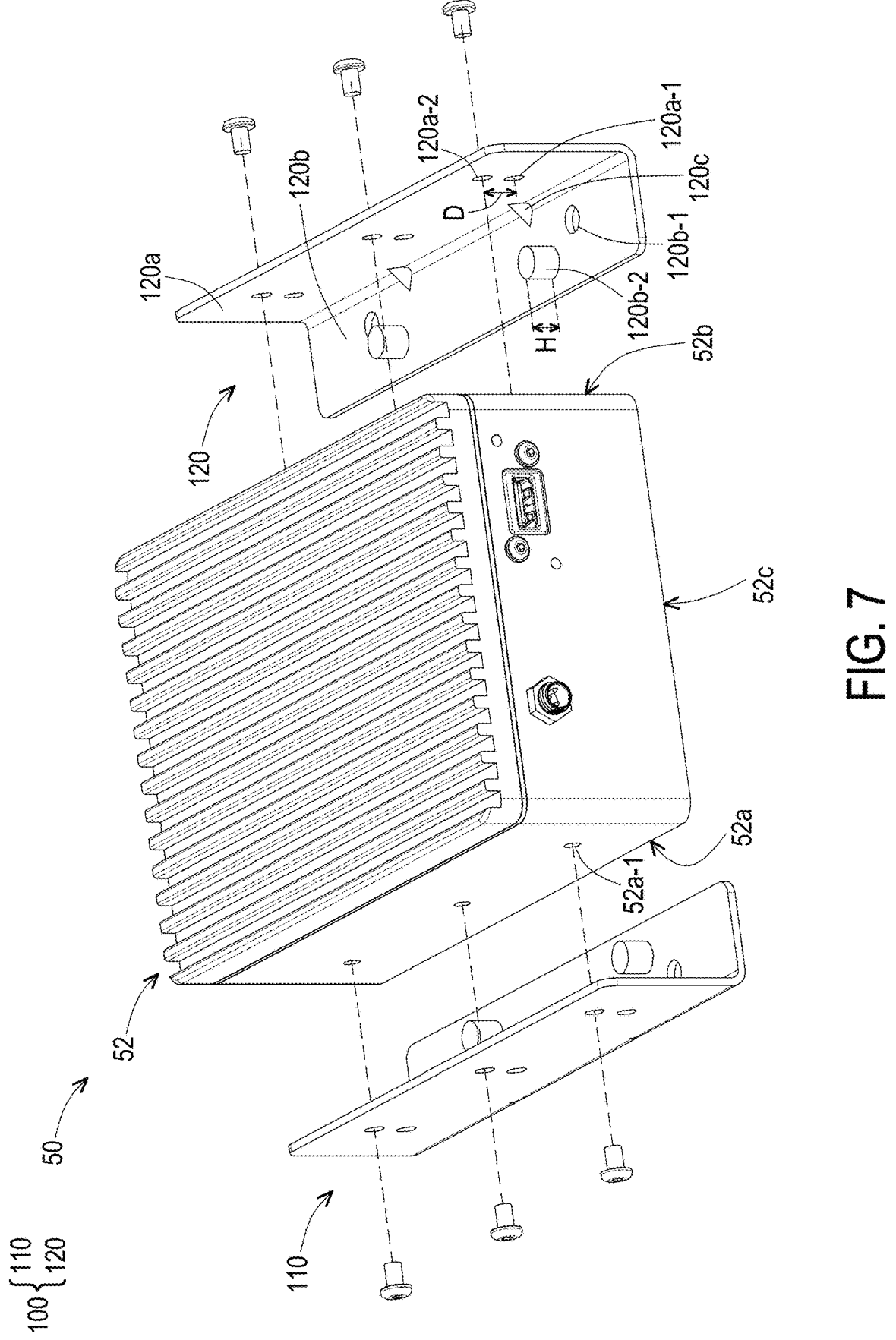
FIG. 7 is a front exploded perspective view of the electronic device of FIG. 1 in the second mounting configuration.
Figure 8:
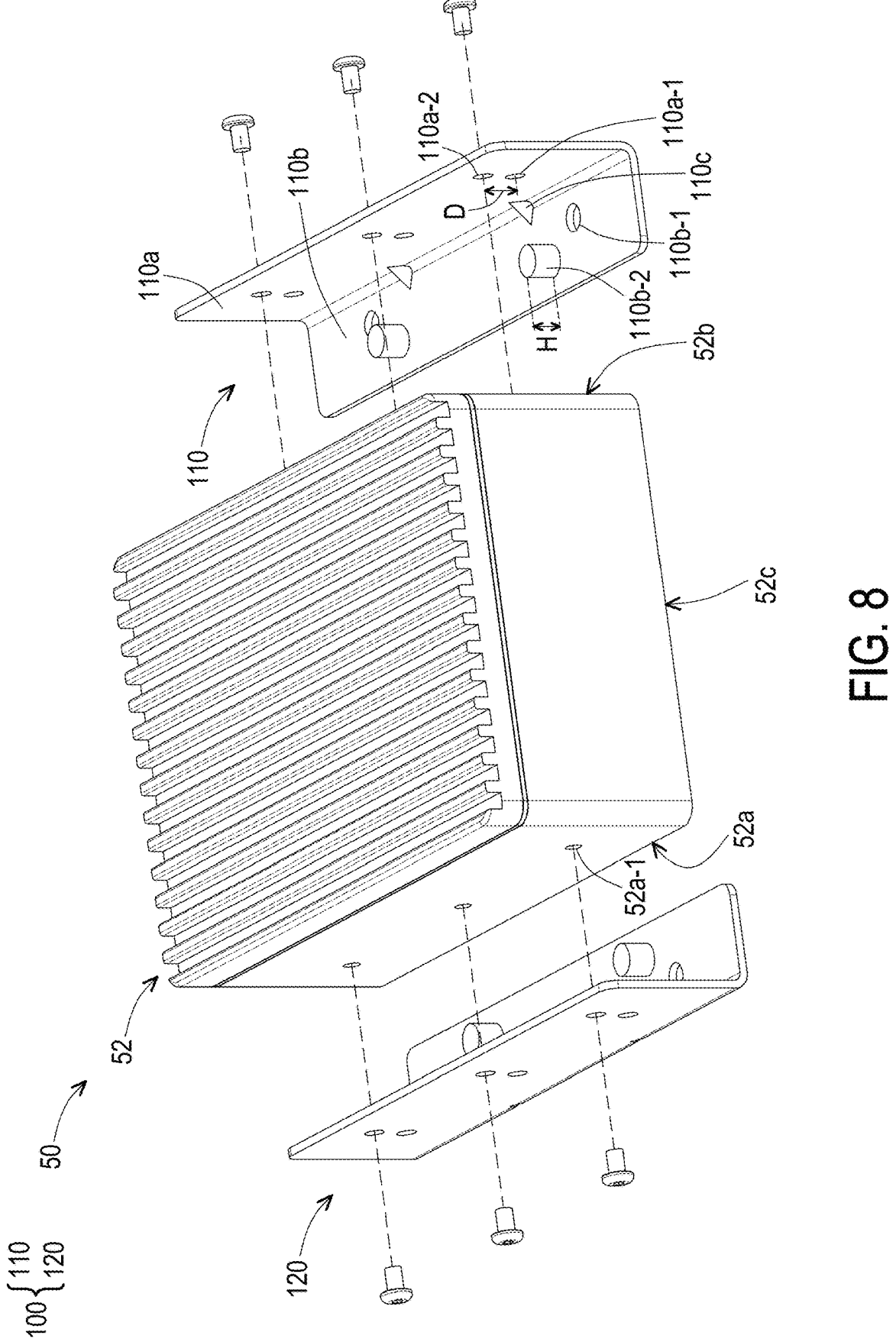
FIG. 8 is a rear exploded perspective view of the electronic device of FIG. 1 in the second mounting configuration.
Figure 9:
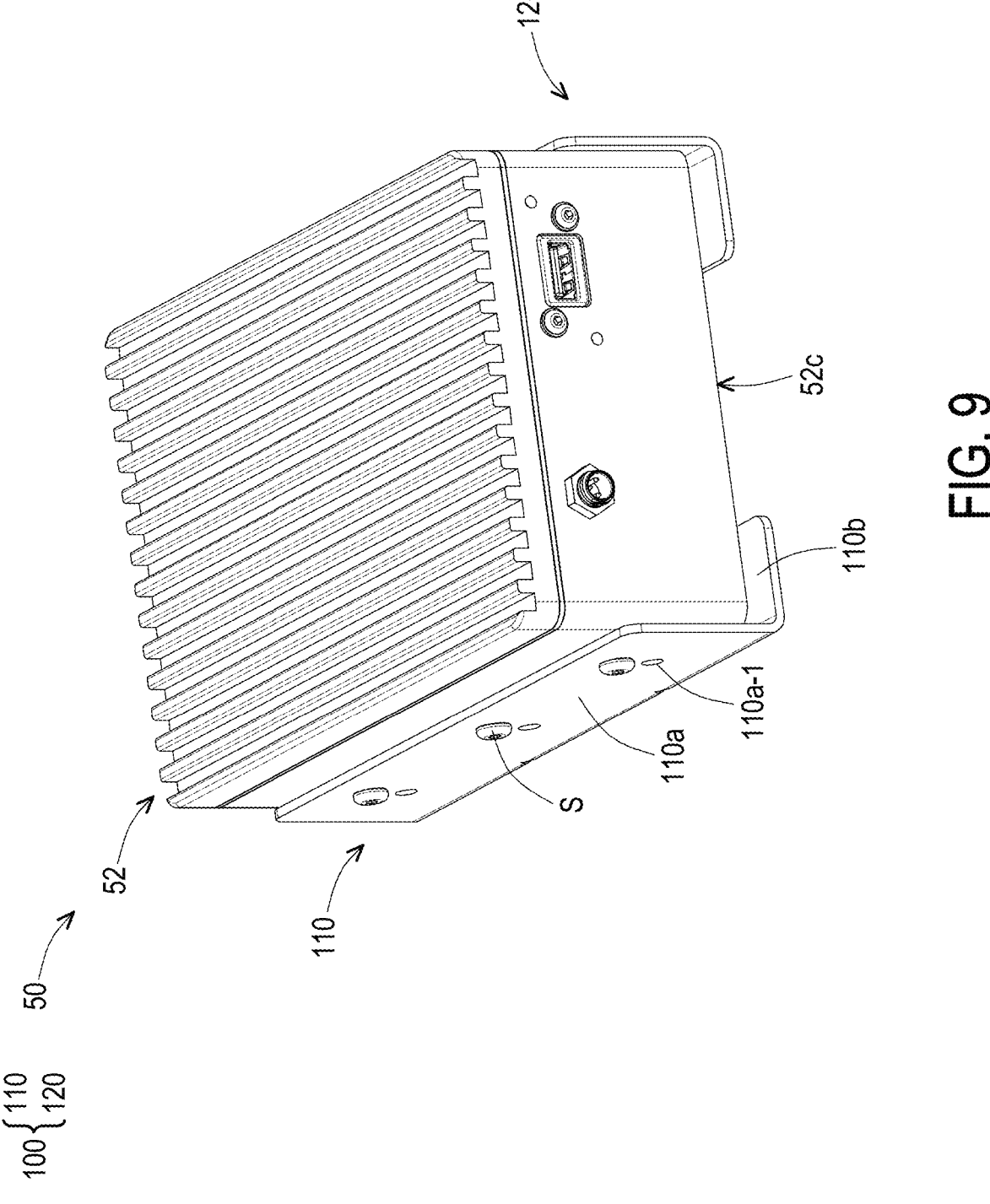
FIG. 9 is a front assembled perspective view of the electronic device of FIG. 1 in the second mounting configuration.
Figure 10:
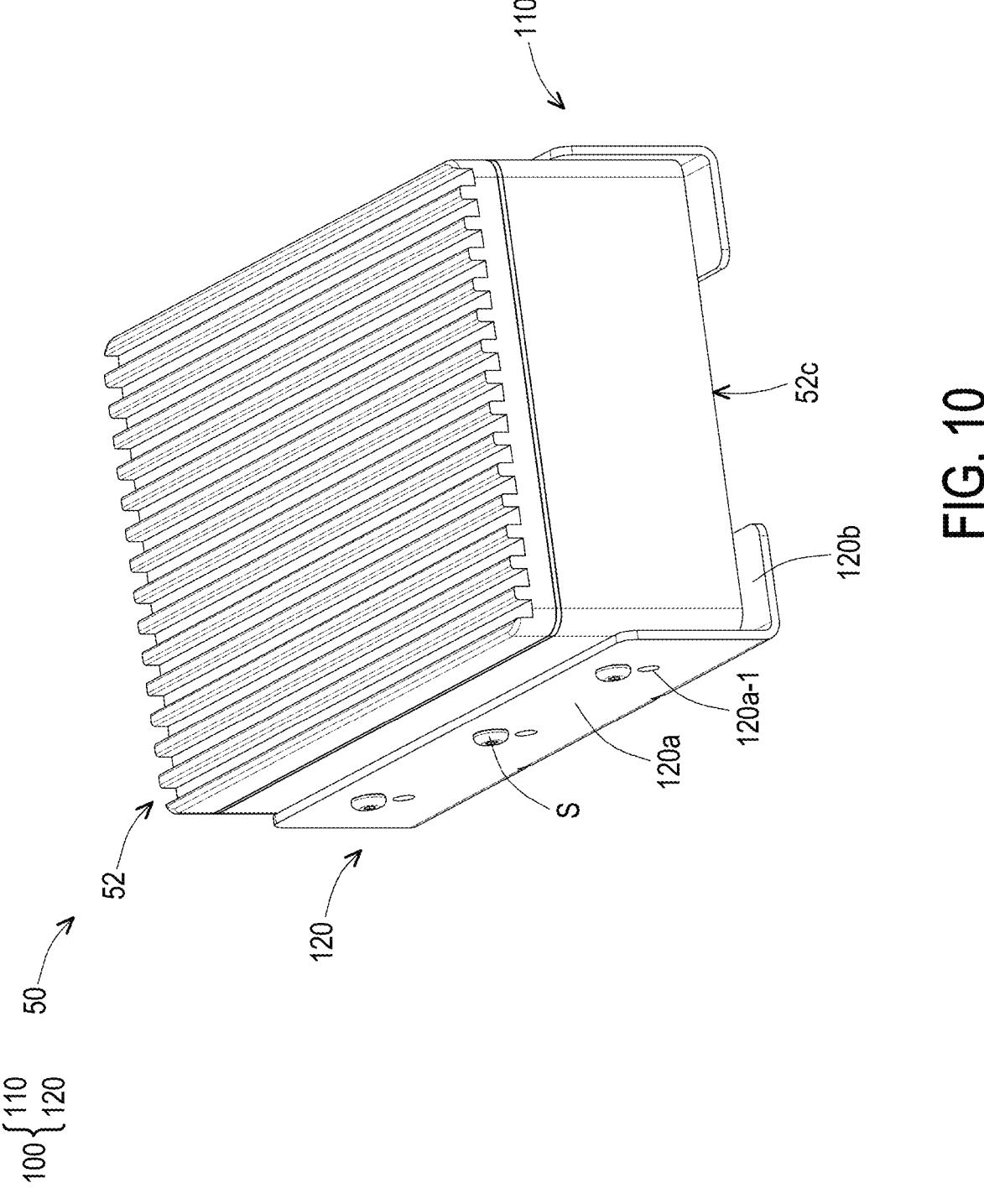
FIG. 10 is a rear assembled perspective view of the electronic device of FIG. 1 in the second mounting configuration.
Figure 11:
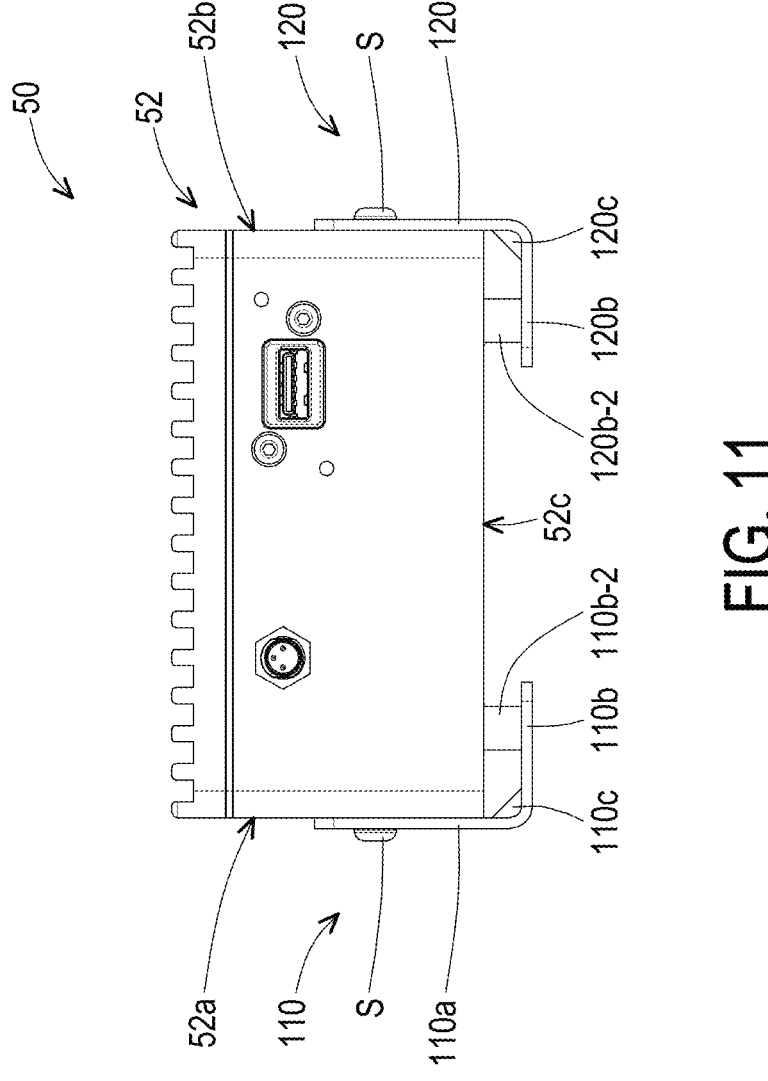
FIG. 11 is a front view of the electronic device of FIG. 9 in the second mounting configuration.
Figure 12:
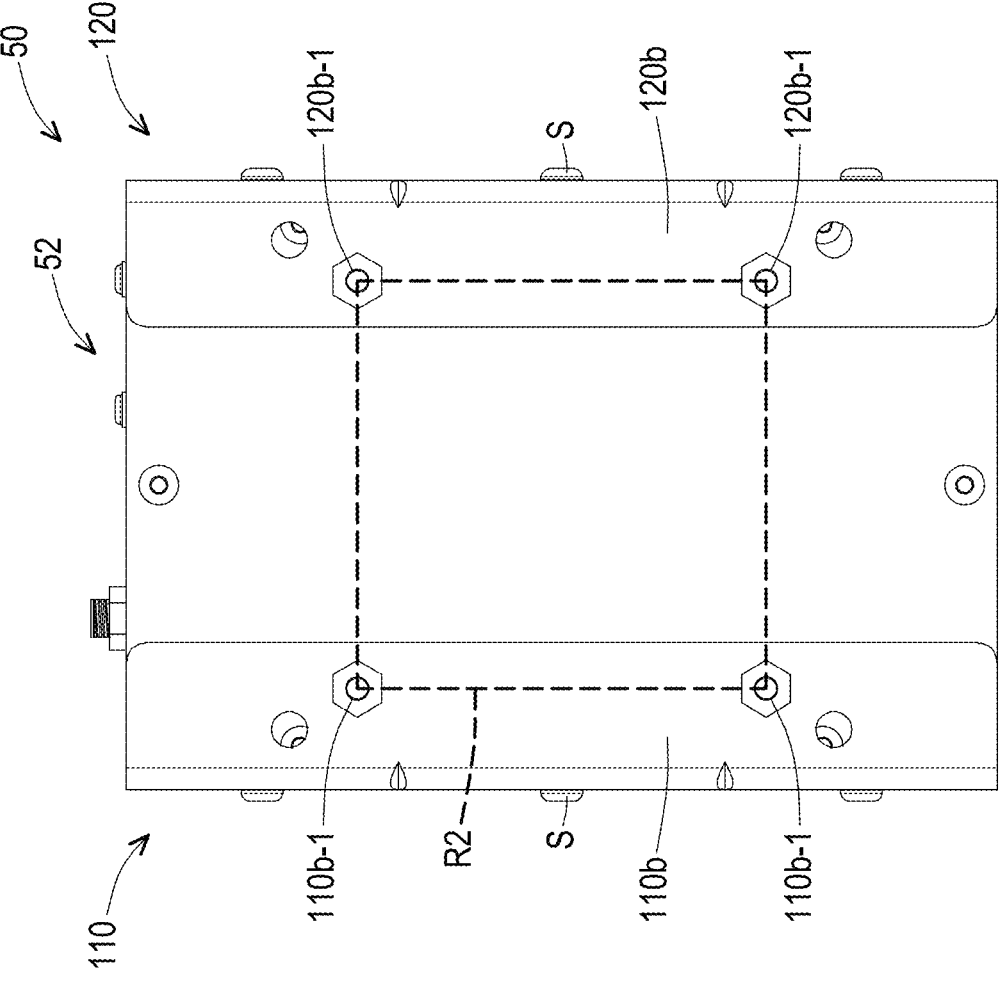
FIG. 12 is a bottom view of the electronic device of FIG. 9 in the second mounting configuration.

Please refer to FIG. 6 and FIG. 12. Either the first shape R1 or the second shape R2 may conform to one of the specifications of the VESA mounting interface standard. In this embodiment, the dimensions of the first shape R1 may be set according to the actual wall mounting requirements, while the dimensions of the second shape R2 may conform to one of the specifications of the VESA mounting interface standard, such as 75 mm×75 mm, but not limited thereto. In another embodiment not illustrated, the dimensions of both the first shape R1 and the second shape R2 may respectively conform to two different specifications of the VESA mounting interface standard.

Figure 3:
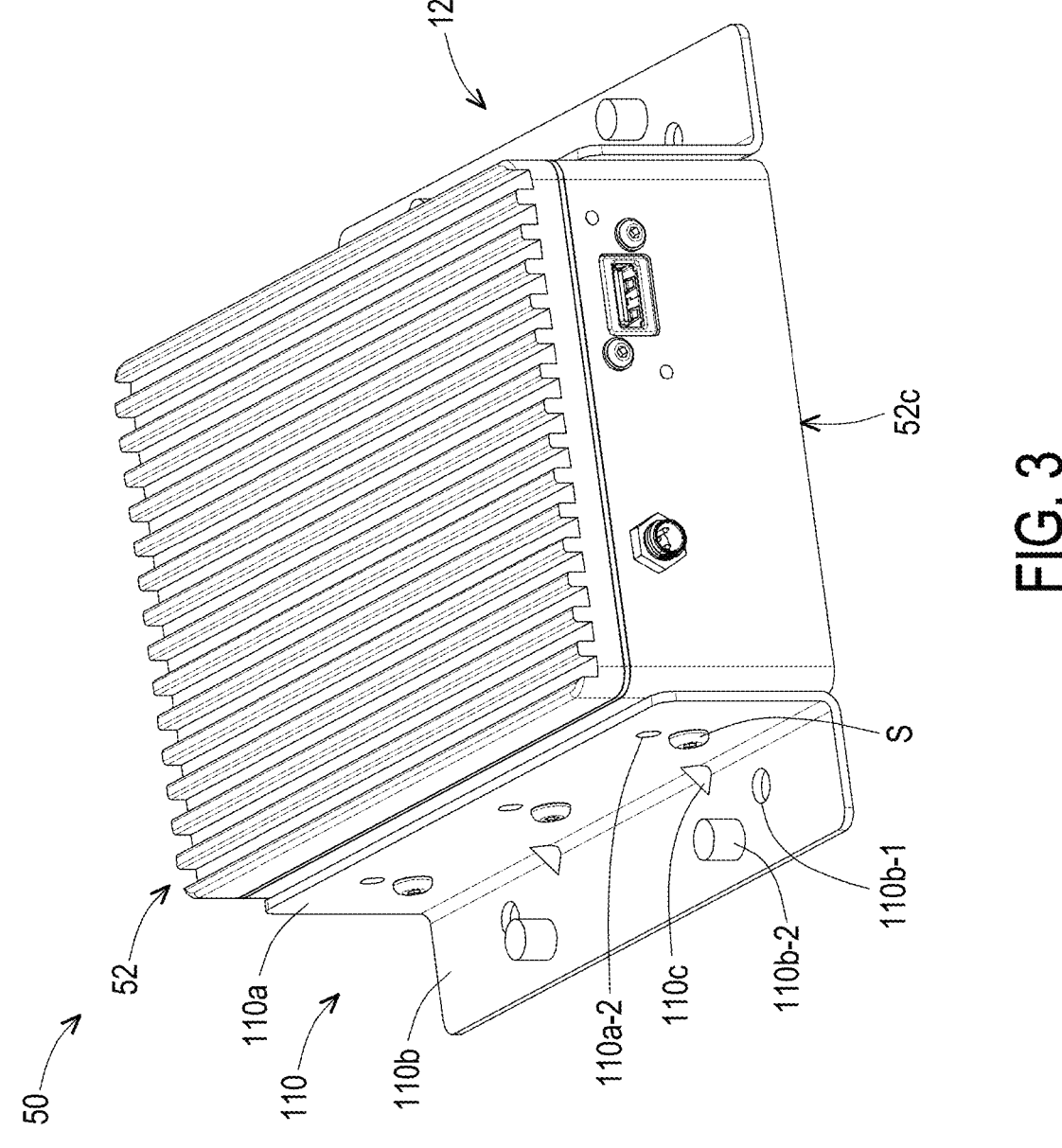
FIG. 3 is a front assembled perspective view of the electronic device of FIG. 1 in the first mounting configuration.

Please refer to FIG. 3, in the present embodiment, the first mounting side 110a may be vertically connected to the first mounting bottom 110b. The first lateral bracket 110 may have at least one first reinforcing rib 110c (illustrated as two in this embodiment). This at least one first reinforcing rib 110c is located at the intersection of the first mounting side 110a and the first mounting bottom 110b, in order to enhance the structural integrity between the first mounting side 110a and the first mounting bottom 110b.

Figure 4:
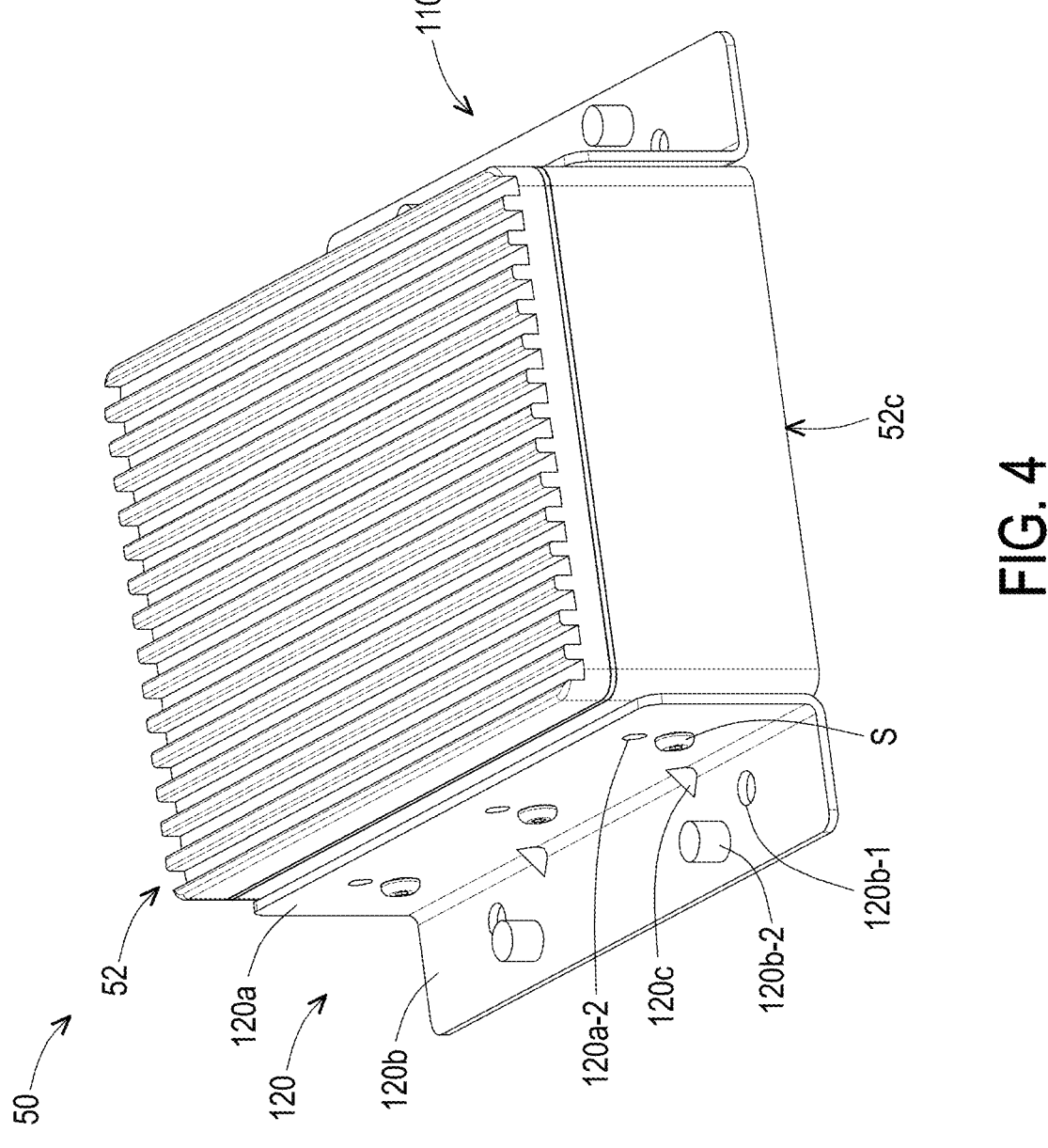
FIG. 4 is a rear assembled perspective view of the electronic device of FIG. 1 in the first mounting configuration.
Figure 5:
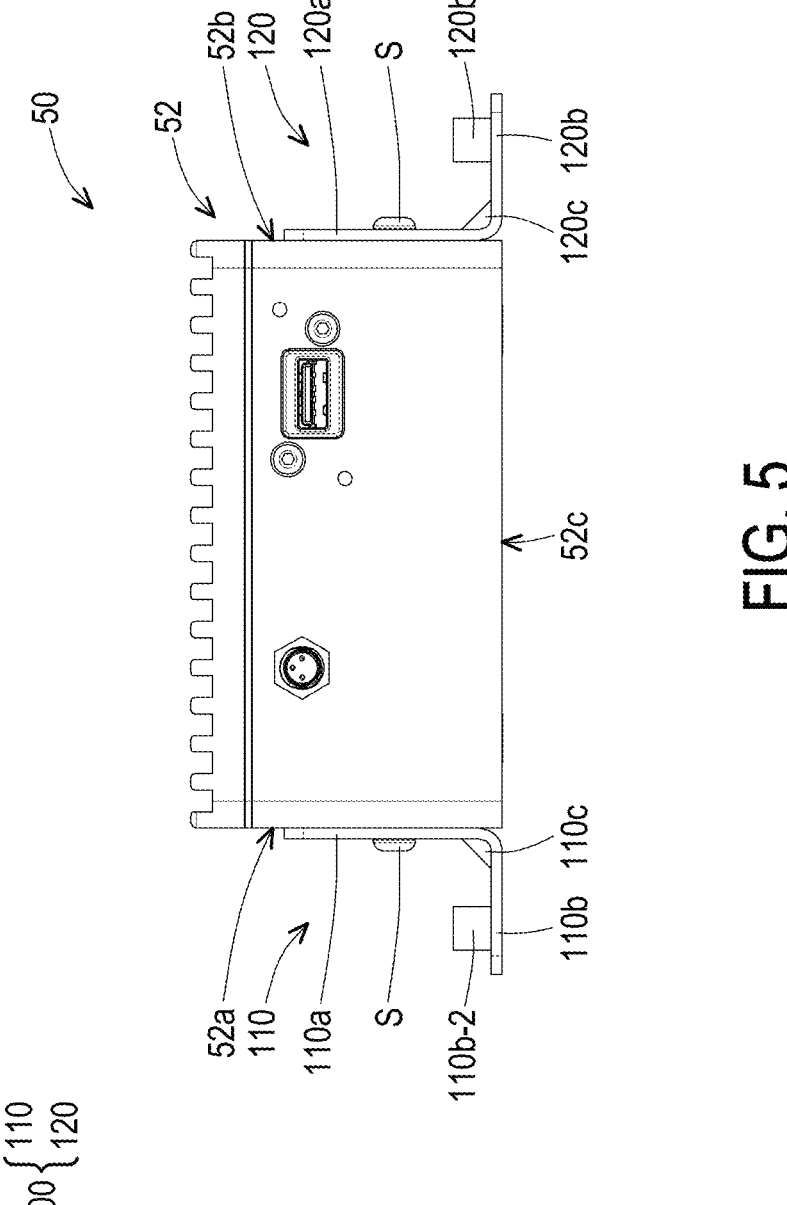
FIG. 5 is a front view of the electronic device of FIG. 3 in the first mounting configuration.

Please refer to FIG. 4, in the present embodiment, the second mounting side 120a may be vertically connected to the second mounting bottom 120b. The second lateral bracket 120 may have at least one second reinforcing rib 120c (illustrated as two in this embodiment). The at least one second reinforcing rib 120c is located at the intersection of the second mounting side 120a and the second mounting bottom 120b, in order to enhance the structural integrity between the first mounting side 110a and the first mounting bottom 110b.

Please refer to FIG. 1 and FIG. 2. In the present embodiment, the first lateral bracket 110 and the second lateral bracket 120 may possess identical external forms and structures. In other words, the first lateral bracket 110 and the second lateral bracket 120 may be two components with identical external forms and structures. Consequently, only one set of molds is required for the production of the first lateral bracket 110 and the second lateral bracket 120, thereby reducing manufacturing costs.

To sum up, in the present disclosure, the first lateral bracket and the second lateral bracket of the electronic device may be fastened to the device body in either a first mounting configuration or a second mounting configuration, thereby enabling the device body to be mounted on one of two distinct specific objects.

What is claimed is:

1. An electronic device, comprising:

a device body, having a first body side, a second body side, and a body bottom surface, wherein the second body side faces away from the first body side, the body bottom surface is connected to the first body side and the second body side, the first body side has at least one first body screw hole, and the second body side has at least one second body screw hole; and a mounting accessory, comprising:

a first lateral bracket, having a first mounting side and a first mounting bottom, wherein the first mounting side has at least one first lower mounting screw hole and at least one first upper mounting screw hole, the first mounting bottom has at least one first bottom mounting screw hole and at least one first bottom mounting stud; and a second lateral bracket, having a second mounting side and a second mounting bottom, wherein the second mounting side has at least one second upper mounting screw hole and at least one second lower mounting screw hole, the second mounting bottom has at least one second bottom mounting screw hole and at least one second bottom mounting stud, wherein a height of the at least one first bottom mounting stud is equal to a distance between the at least one first bottom mounting screw hole and the at least one first upper mounting screw hole, a height of the at least one second bottom mounting stud is equal to a distance between the at least one second bottom mounting screw hole and the at least one second upper mounting screw hole, wherein when the at least one first lower mounting screw hole is fastened to the at least one first body screw hole by screws, and the at least one second lower mounting screw hole is fastened to the at least one second body screw hole by the screws, the first lateral bracket and the second lateral bracket are respectively fixed on the device body, the at least one first bottom mounting stud is positioned outside the first mounting side relative to the device body, and the at least one second bottom mounting stud is positioned outside the second mounting side relative to the device body, and a connection between the at least one first bottom mounting screw hole and the at least one second bottom mounting screw hole forms a straight line or a first shape, wherein when the at least one first upper mounting screw hole is fastened to the at least one first body screw hole by the screws, and the at least one second upper mounting screw hole is fastened to the at least one second body screw hole by the screws, the first lateral bracket and the second lateral bracket are respectively fixed on the device body, the at least one first bottom mounting stud is positioned inside the first mounting side relative to the device body, the at least one second bottom mounting stud is positioned inside the first mounting side relative to the device body, and a connection between the at least one first bottom mounting stud and the at least one second bottom mounting stud forms a straight line or a second shape.

2. The electronic device according to claim 1, wherein the first shape or the second shape conforms to one specification of VESA mounting interface standard.

3. The electronic device according to claim 1, wherein dimensions of the first shape and the second shape conform to two specifications of VESA mounting interface standard.

4. The electronic device according to claim 1, wherein the first mounting side is vertically connected to the first mounting bottom, the second mounting side is vertically connected to the second mounting bottom, the first lateral bracket has at least one first reinforcing rib, the at least one first reinforcing rib is located at an intersection of the first mounting side and the first mounting bottom, the second lateral bracket has at least one second reinforcing rib, the at least one second reinforcing rib is located at an intersection of the second mounting side and the second mounting bottom.

5. The electronic device according to claim 1, wherein the first lateral bracket and the second lateral bracket have a same shape and structure.

6. A mounting accessory, adaptable for mounting a device body of an electronic device, wherein the device body has a first body side, a second body side, and a body bottom surface, the second body side faces away from the first body side, the body bottom surface is connected to the first body side and the second body side, the first body side has at least one first body screw hole, and the second body side has at least one second body screw hole, the mounting accessory comprises:

a first lateral bracket, having a first mounting side and a first mounting bottom, wherein the first mounting side has at least one first lower mounting screw hole and at least one first upper mounting screw hole, the first mounting bottom has at least one first bottom mounting screw hole and at least one first bottom mounting stud; and a second lateral bracket, having a second mounting side and a second mounting bottom, wherein the second mounting side has at least one second upper mounting screw hole and at least one second lower mounting screw hole, the second mounting bottom has at least one second bottom mounting screw hole and at least one second bottom mounting stud, wherein a height of the at least one first bottom mounting stud is equal to a distance between the at least one first bottom mounting screw hole and the at least one first upper mounting screw hole, a height of the at least one second bottom mounting stud is equal to a distance between the at least one second bottom mounting screw hole and the at least one second upper mounting screw hole, wherein when the at least one first lower mounting screw hole is fastened to the at least one first body screw hole by screws, and the at least one second lower mounting screw hole is fastened to the at least one second body screw hole by the screws, the first lateral bracket and the second lateral bracket are respectively fixed on the device body, the at least one first bottom mounting stud is positioned outside the first mounting side relative to the device body, the at least one second bottom mounting stud is positioned outside the second mounting side relative to the device body, and a connection between the at least one first bottom mounting screw hole and the at least one second bottom mounting screw hole forms a straight line or a first shape, wherein when the at least one first upper mounting screw hole is fastened to the at least one first body screw hole by the screws, and the at least one second upper mounting screw hole is fastened to the at least one second body screw hole by the screws, the first lateral bracket and the second lateral bracket are respectively fixed on the device body, the at least one first bottom mounting stud is positioned inside the first mounting side relative to the device body, the at least one second bottom mounting stud is positioned inside the first mounting side relative to the device body, and a connection between the at least one first bottom mounting stud and the at least one second bottom mounting stud forms a straight line or a second shape.

7. The mounting accessory according to claim 6, wherein the first shape or the second shape conforms to one specification of VESA mounting interface standard.

8. The mounting accessory according to claim 6, wherein dimensions of the first shape and the second shape conform to two specifications of VESA mounting interface standard.

9. The mounting accessory according to claim 6, wherein the first mounting side is vertically connected to the first mounting bottom, the second mounting side is vertically connected to the second mounting bottom, the first lateral bracket has at least one first reinforcing rib, the at least one first reinforcing rib is located at an intersection of the first mounting side and the first mounting bottom, the second lateral bracket has at least one second reinforcing rib, the at least one second reinforcing rib is located at an intersection of the second mounting side and the second mounting bottom.

10. The mounting accessory according to claim 6, wherein the first lateral bracket and the second lateral bracket have a same shape and structure.

* * * * *